(12) United States Patent
Zhang et al.

(10) Patent No.: US 9,806,102 B2
(45) Date of Patent: Oct. 31, 2017

(54) DISPLAY SUBSTRATE AND METHOD FOR FABRICATING THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qian Zhang, Beijing (CN); Tingze Dong, Beijing (CN); Xiuliang Wang, Beijing (CN); Xuejiao Huang, Beijing (CN); Zhao Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/123,228

(22) PCT Filed: Sep. 25, 2015

(86) PCT No.: PCT/CN2015/090709
§ 371 (c)(1),
(2) Date: Sep. 1, 2016

(87) PCT Pub. No.: WO2016/201820
PCT Pub. Date: Dec. 22, 2016

(65) Prior Publication Data
US 2017/0162598 A1 Jun. 8, 2017

(30) Foreign Application Priority Data
Jun. 18, 2015 (CN) .......................... 2015 1 0342460

(51) Int. Cl.
*G02F 1/1335* (2006.01)
*H01L 27/12* (2006.01)
(Continued)

(52) U.S. Cl.
CPC .......... *H01L 27/124* (2013.01); *G02F 1/1337* (2013.01); *G02F 1/133707* (2013.01);
(Continued)

(58) Field of Classification Search
None
See application file for complete search history.

(56) References Cited

U.S. PATENT DOCUMENTS

2005/0195353 A1* 9/2005 Park .................. G02F 1/133555
349/139
2006/0256268 A1 11/2006 Jeong et al.
(Continued)

FOREIGN PATENT DOCUMENTS

CN 1782833 A 6/2006
CN 1862328 A 11/2006
(Continued)

OTHER PUBLICATIONS

International Search Report and Written Opinion in PCT/CN2015/090709 dated Feb. 6, 2016, with English translation. 14 pages.
(Continued)

*Primary Examiner* — Minh-Loan Tran
(74) *Attorney, Agent, or Firm* — Blakely Sokoloff Taylor & Zafman LLP

(57) ABSTRACT

A display substrate, a method for fabricating the same, and a display device are disclosed. The display substrate comprises a plurality of pixels; and a plurality of slit patterns, which are arranged between at least two of the plurality of pixels, and comprise a plurality of slits arranged in a rubbing direction. Slit patterns are provided, and each of slit patterns comprises slits in the rubbing direction. Thus, during a rubbing alignment process, the slit patterns can guide a rubbing cloth to move in the rubbing direction. Accordingly, the alignment of the rubbing cloth is prevented from changing in the rubbing process, a good alignment layer is formed, rubbing Mura is avoided, and the lifetime of the rubbing cloth is extended.

20 Claims, 5 Drawing Sheets

(51) Int. Cl.
  *G02F 1/1337* (2006.01)
  *G02F 1/1343* (2006.01)
(52) U.S. Cl.
  CPC .. *G02F 1/134309* (2013.01); *G02F 1/134336* (2013.01); *H01L 27/127* (2013.01); *H01L 27/1248* (2013.01)

(56) References Cited

U.S. PATENT DOCUMENTS

| | | |
|---|---|---|
| 2007/0064130 A1 | 3/2007 | Hollins et al. |
| 2007/0064193 A1 | 3/2007 | Kurasawa |
| 2007/0177096 A1* | 8/2007 | Uchida ............. G02F 1/133707 349/177 |
| 2009/0273746 A1* | 11/2009 | Uehara ............. G02F 1/133555 349/106 |
| 2016/0011455 A1 | 1/2016 | Wu |

FOREIGN PATENT DOCUMENTS

| | | |
|---|---|---|
| CN | 101571642 A | 11/2009 |
| CN | 103412441 A | 11/2013 |
| CN | 203337968 U | 12/2013 |
| CN | 104865752 A | 8/2015 |

OTHER PUBLICATIONS

Office Action in Chinese Application No. 201510342460.7 dated May 2, 2017, with English translation.

* cited by examiner

DISPLAY SUBSTRATE AND METHOD FOR FABRICATING THE SAME AND DISPLAY DEVICE

RELATED APPLICATIONS

The present application claims the benefit of Chinese Patent Application No. 201510342460.7, filed on Jun. 18, 2015, the entire disclosure of which is incorporated herein by reference

TECHNICAL FIELD

The present invention relates to the field of display technology, and particularly to a display substrate, a method for fabricating a display substrate and a display device.

BACKGROUND

Currently, ADS (Advanced Super Dimension Switch) is a hard-screen display panel, and the following defects easily occur during a rubbing process.

1 Peripheral block. The state of a rubbing cloth is affected by the dummy region between display panels. When the substrate (e.g., a glass substrate) is offset on a rubbing machine by an angle as small as 0.1°, this defect occurs.

2 Electrical test pad V-Block. Since the state of the rubbing cloth is affected bin a region where an electrical test pad is arranged, V-Blocks occur in corresponding regions.

3 Bonding pad V-Block. The state of the rubbing cloth is affected by the state of wirings in the bonding pad region, and V-Blocks of a wide strip shape occur at the middle of the display panel.

4 Cell pollution/Drop Mura. The rubbing effect in the SD Shadow (data line shadow) region is poor, and leakage defect occurs.

5 Rubbing Mura. Other factors cause inhomogeneous rubbing, and vertical Mura occurs.

The basic cause for these rubbing related defects lies in that morphological difference in the substrate affects the state of the rubbing cloth, and thus leads to alignment difference.

Rubbing Mura is a serious quality problem arising from the fabrication process, severely affects the picture quality, and has a low detection rate in the electrical test. This not only leads to great waste in materials and equipment at the back end, but also leads to a quality problem. Especially for a high-end product like ADS, improving Rubbing Mura is of vital importance, because with increasing requirement of the customer experience, the requirement for Rubbing Mura is increasingly strict. The basic cause for this defect is not the rubbing process, and the improvement by optimizing the process is limited.

SUMMARY

The present invention intends to alleviate or eliminate Mura arising from the rubbing alignment process or other problems.

To this end, an embodiment of the present invention provides a display substrate, comprising:
a plurality of pixels, and
a plurality of slit patterns, which are arranged between at least two of the plurality of pixels respectively and comprise a plurality of slits arranged in a rubbing direction.

In an exemplary embodiment, the display substrate comprises a plurality of functional layers,
wherein the plurality of slit patterns are arranged on at least one of the plurality of functional layers.

The plurality of functional layers comprise: a source/drain layer, a gate metal layer, a gate insulating layer, a semiconductor layer, a passivation layer, a pixel electrode layer, a common electrode layer, and a color filter layer.

In an exemplary embodiment, the slit patterns comprise:
a plurality of channels arranged on a gate metal layer in the rubbing direction, wherein the channels have a depth smaller than the thickness of the gate metal layer;
a gate insulating layer arranged over the gate metal layer;
a passivation layer arranged over the gate insulating layer;
an electrode layer arranged over the passivation layer.

In an exemplary embodiment, the slit patterns comprise:
a plurality of metal lines arranged in the rubbing direction, wherein the plurality of metal lines are arranged in a same layer as a source/drain of the plurality of pixels;
a passivation layer arranged on the plurality of metal lines and between neighboring metal lines;
an electrode layer arranged over the passivation layer.

In an exemplary embodiment, the slit patterns comprise:
a plurality of semiconductor lines arranged in the rubbing direction,
wherein the plurality of semiconductor lines are arranged in a same layer as an active layer of the plurality of pixels;
a passivation layer arranged on the plurality of semiconductor lines and between neighboring semiconductor lines;
an electrode layer arranged over the passivation layer.

In an exemplary embodiment, the slit patterns comprise:
a plurality of semiconductor lines arranged in the rubbing direction,
wherein the plurality of semiconductor lines are arranged in a same layer as an active layer of the plurality of pixels;
a plurality of metal lines arranged on the plurality of semiconductor lines and in the rubbing direction,
wherein the plurality of metal lines are arranged in a same layer as a source/drain of the plurality of pixels;
a passivation layer arranged on the plurality of metal lines and between neighboring metal lines;
an electrode layer arranged over the passivation layer.

In an exemplary embodiment, the slit patterns are arranged in a topmost layer of the plurality of functional layers at positions corresponding to gate lines or data lines.

In an exemplary embodiment, each slit of the slit patterns has a width of 13 µm~15 µm.

An embodiment of the present invention further provides a display device, comprising any one of the display substrate as described above.

An embodiment of the present invention further provides a method for fabricating a display substrate, comprising:
during forming a plurality of pixels, forming a plurality of slit patterns between at least two pixels of the plurality of pixels, wherein the plurality of slit patterns comprise a plurality of slits in a rubbing direction.

In an exemplary embodiment, forming the plurality of slit patterns comprises:
forming the plurality of slit patterns on at least one of the plurality of functional layers.

In an exemplary embodiment, forming the slit patterns comprises:
after forming a gate metal layer of the plurality of pixels, etching the gate metal layer to form a plurality of channels on the gate metal layer in the rubbing direction, wherein the channels have a depth smaller than the thickness of the gate metal layer;

forming a gate insulating layer over the gate metal layer;
forming a passivation layer over the gate insulating layer;
forming an electrode layer over the passivation layer.

In an exemplary embodiment, forming the slit patterns comprises:

during forming a source/drain of the plurality of pixels, forming a plurality of metal lines in the rubbing direction between neighboring pixels in the plurality of pixels;

forming a passivation layer over the plurality of metal lines and between neighboring metal lines;

forming an electrode layer over the passivation layer.

In an exemplary embodiment, forming the slit patterns comprises:

during forming an active layer of the plurality of pixels, forming a plurality of semiconductor lines in the rubbing direction between neighboring pixels in the plurality of pixels;

forming a passivation layer over the plurality of semiconductor lines and between neighboring semiconductor lines;

forming an electrode layer over the passivation layer.

In an exemplary embodiment, forming the slit patterns comprises:

during forming an active layer of the plurality of pixels, forming a plurality of semiconductor lines in the rubbing direction between neighboring pixels in the plurality of pixels;

during forming a source/drain of the plurality of pixels, forming a plurality of metal lines in the rubbing direction over the plurality of semiconductor lines;

forming a passivation layer over the plurality of metal lines and between neighboring metal lines;

forming an electrode layer over the passivation layer.

In an exemplary embodiment, forming the slit patterns comprises:

forming the slit patterns in a topmost layer of the plurality of functional layers at positions corresponding to gate lines or data lines.

According to the above technical solutions, slit patterns are arranged in the rubbing direction, and each of slit patterns comprises slits in the rubbing direction. During the rubbing alignment process (for forming an alignment layer), the slit patterns can guide a rubbing cloth to move in the rubbing direction. Accordingly, the alignment of the rubbing cloth is prevented from changing in the rubbing process, a good alignment layer is formed, rubbing Mura is avoided, and the lifetime of the rubbing cloth is extended.

BRIEF DESCRIPTION OF THE DRAWINGS

Embodiments of the present invention will be described in detail hereinafter with reference to the drawings, in which.

DETAILED DESCRIPTION OF EMBODIMENTS

Figure 1:
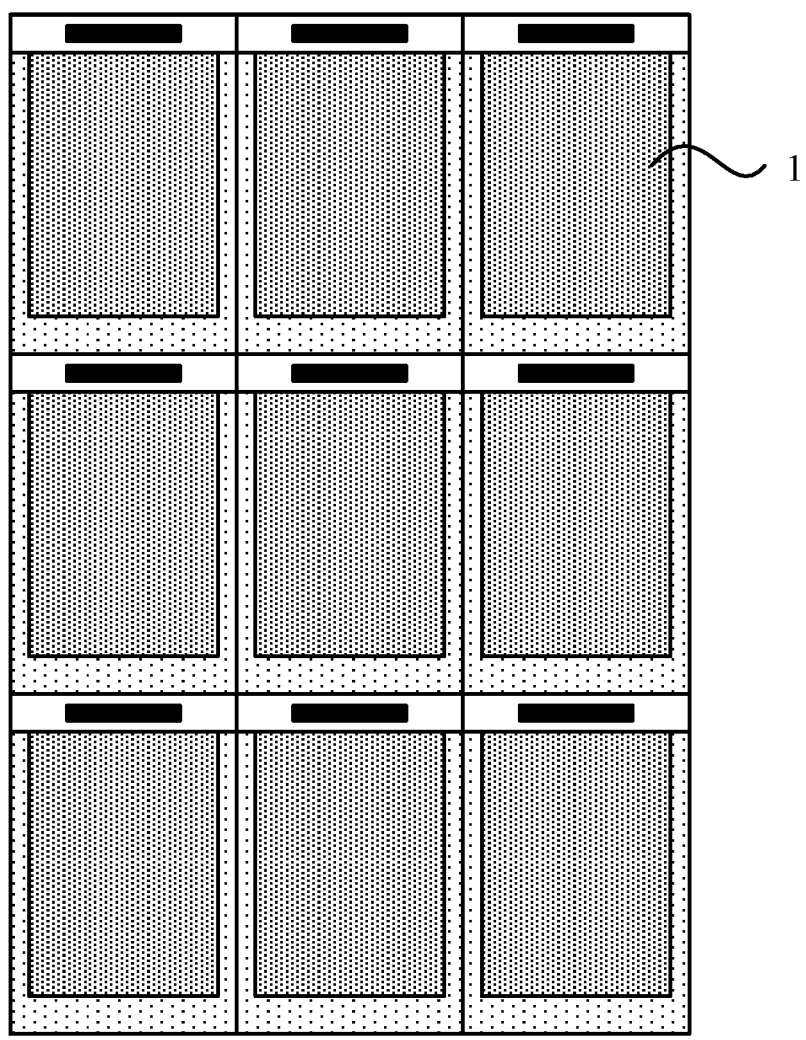
FIG. 1 shows a structural diagram for a display panel in the prior art.

The technical solutions in embodiments of the present invention will be described clearly and completely with reference to the drawings in the embodiments of the present invention. It is noted that, embodiments and features in embodiments can be combined with each other in case no conflict occurs.

Apparently, the embodiments described are only a part of rather than all of the embodiments of the present invention. Based on the embodiments in the present invention, all other embodiments obtained by the ordinary skilled person in the art on the premise of not paying any creative work belong to the protection scope of the present invention.

Reference numerals: 1 pixel; 2 slit pattern; 21 base plate; 22 gate metal layer; 23 gate insulating layer; 24 metal line; 25 passivation layer; 26 electrode layer; 27 semiconductor line.

Figure 2:
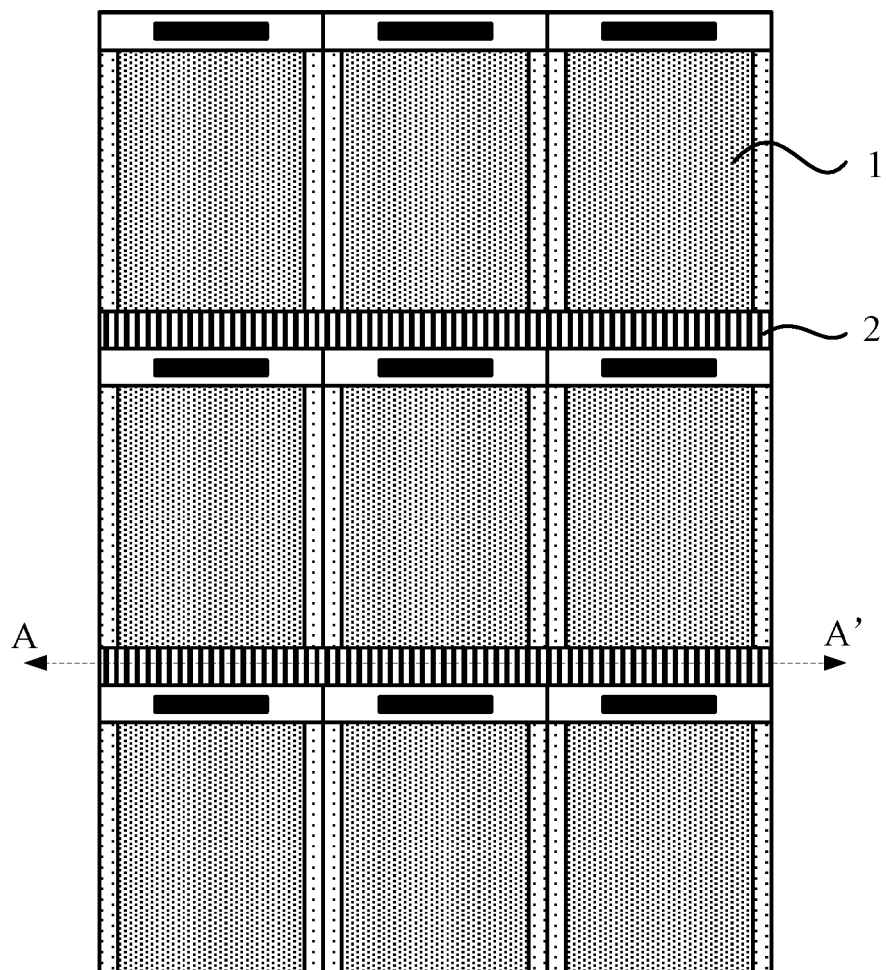
FIG. 2 shows a structural diagram of a display panel according to an embodiment of the present invention.

As shown in FIG. 2, in an embodiment of the present invention, a display substrate comprises:

a plurality of pixels 1, a plurality of slit patterns 2, which are arranged between at least two pixels 1 in the plurality of pixels 1, and comprise a plurality of slits which are arranged in a rubbing direction.

FIG. 1 shows a structure of a display panel in the prior art. In FIG. 1, a structure capable of guiding a rubbing cloth is absent on a substrate. When the rubbing cloth moves in a rubbing direction during the rubbing alignment process, the rubbing cloth is prone to offset in the moving direction due to the structural factors of the substrate and external factors, and Mura is produced in the rubbing process.

The slit patterns 2 have a plurality of slits in the rubbing direction. The rubbing direction is a predefined moving direction for the rubbing cloth in the rubbing alignment process. During the rubbing alignment process, the slit patterns 2 can guide the rubbing cloth to move in the rubbing direction. Accordingly, the alignment of the rubbing cloth is prevented from changing in the rubbing process, a good alignment layer is formed, rubbing Mura is avoided, and the lifetime of the rubbing cloth is extended.

Furthermore, the slit patterns 2 are arranged between neighboring pixels of the plurality of pixels. In this way, it is ensured that the rubbing cloth is continuously guided by the slit patterns 2 during the rubbing alignment process. The accuracy of the rubbing alignment direction is ensured, and rubbing Mura is further avoided. Further, the rubbing cloth is prevented from rubbing in a non-rubbing direction during the rubbing process and thus from being damaged, which extends the lifetime of the rubbing cloth.

In the structure shown in FIG. 1, the slit patterns 2 are only arranged at positions corresponding to gate lines, i.e., arranged horizontally as a whole. In fact, when required, the slit patterns 2 can be arranged at positions corresponding to data lines, i.e., arranged longitudinally as a whole. In both horizontal arrangement and longitudinal arrangement, slits in the slit patterns 2 are arranged in the rubbing direction.

In an exemplary embodiment, the display substrate comprises a plurality of functional layers, wherein the plurality of slit patterns are arranged on at least one functional layer of the plurality of functional layers.

In an exemplary embodiment, the plurality of functional layers comprise: a source/drain layer, a gate metal layer, a gate insulating layer, a semiconductor layer, a passivation layer, a pixel electrode layer, a common electrode layer, and a color filter layer.

Figure 3:
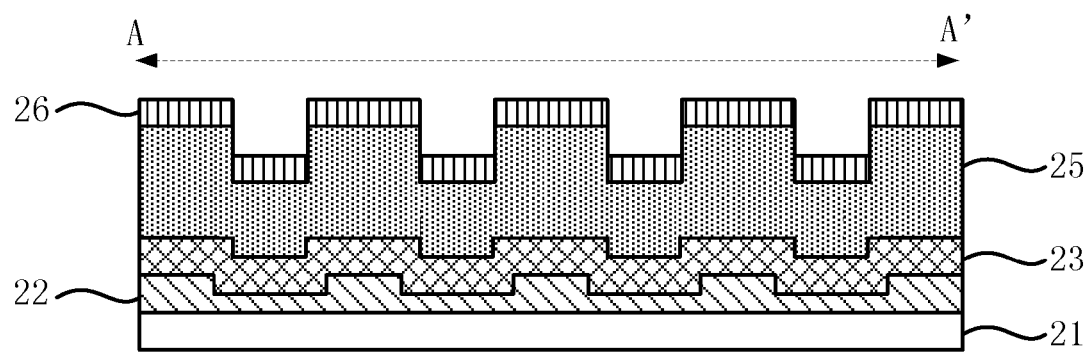
FIG. 3 shows a cross-sectional view along AA' of a display panel according to an embodiment of the present invention.

As shown in FIG. 3, for example, the slit patterns 2 comprise:

a plurality of channels arranged on a gate metal layer 22 (arranged in a same layer as gate lines) in the rubbing direction, wherein the channels have a depth smaller than the thickness of the gate metal layer;

a gate insulating layer 23 arranged over the gate metal layer;

a passivation layer arranged over the gate insulating layer 25;

an electrode layer 26 arranged over passivation layer.

The channels in the gate metal layer have a depth smaller than the thickness of the gate metal layer. It can be ensured that the gate metal layer (gate lines) will not break for normally transmitting scanning signals.

The channels of the gate metal layer are arranged in the rubbing direction. When the gate insulating layer 23 is formed on the gate metal layer, the gate insulating layer will be formed not only right above gate lines, but also in the channels, and grooves are formed at positions corresponding to channels. The grooves are parallel with channels, i.e., along the rubbing direction. Similarly, when the passivation layer 25 is formed on the gate insulating layer 23, grooves will also be formed at positions corresponding to grooves in the gate insulating layer. Furthermore, in the electrode layer 26 formed over the passivation layer 25, grooves in the rubbing direction will also be formed at positions corresponding to grooves in the passivation layer 25, thus forming the slit patterns 2.

Since the slit patterns 2 are arranged in the rubbing direction, during the rubbing alignment process, the slit patterns 2 can guide the rubbing cloth to move in the rubbing direction. Accordingly, the alignment of the rubbing cloth is prevented from changing in the rubbing process, a good alignment layer is formed, and rubbing Mura is avoided.

Figure 4:
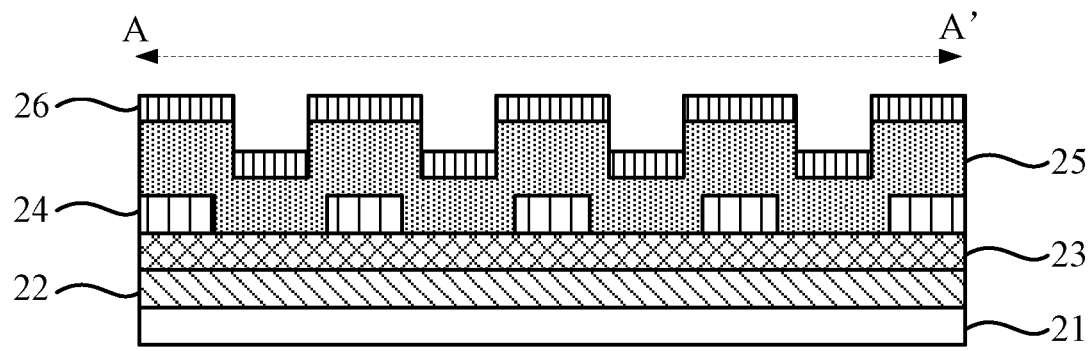
FIG. 4 shows a cross-sectional view along AA' of a display panel according to another embodiment of the present invention.

As shown in FIG. 4, for example, the slit patterns 2 comprise:

a plurality of metal lines 24 arranged in the rubbing direction, wherein the plurality of metal lines 24 are arranged in a same layer as a source/drain (not shown) in the plurality of pixels 1, wherein by forming the metal lines 24 in a same layer as the source/drain, the fabricating process can be simplified;

a passivation layer 25 arranged over the plurality of metal lines 24 and between neighboring metal lines 24;

an electrode layer 26 arranged over the passivation layer 25.

The plurality of metal lines 24 are arranged in the rubbing direction. When the passivation layer 25 is formed on the plurality of metal lines 24, the passivation layer 25 will be formed not only right above the metal lines 24, but also between neighboring metal lines 24. As a result, the passivation layer 25 between neighboring metal lines 24 is lower than the passivation layer 25 right above the metal lines 24, and grooves are formed between neighboring metal lines 24. The grooves are parallel with the plurality of metal lines 24, i.e., along the rubbing direction. Furthermore, in the electrode layer 26 formed over the passivation layer 25, grooves in the rubbing direction will also be formed at grooves in the passivation layer 25, thus forming the slit patterns 2.

Since the slit patterns 2 are arranged in the rubbing direction, during the rubbing process, the slit patterns 2 can guide the rubbing cloth to move in the rubbing direction. Accordingly, the alignment of the rubbing cloth is prevented from changing in the rubbing process, a good alignment layer is formed, and rubbing Mura is avoided.

Figure 5:
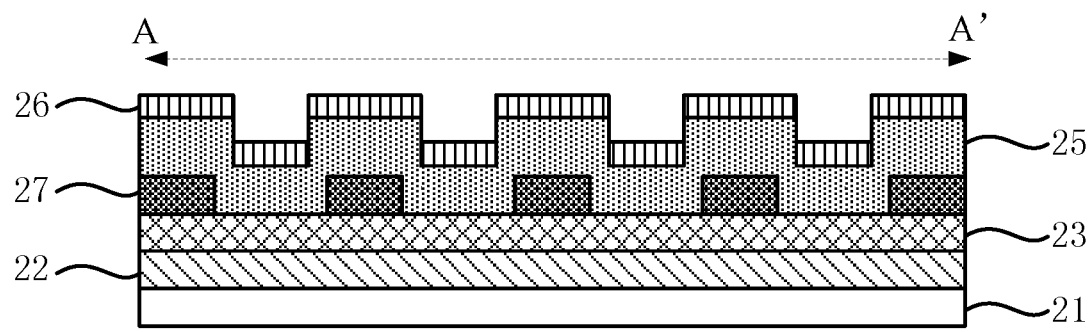
FIG. 5 shows a cross-sectional view along AA' of a display panel according to another embodiment of the present invention.

As shown in FIG. 5, for example, the slit patterns 2 comprise:

a plurality of semiconductor lines 27 arranged in the rubbing direction, wherein the plurality of semiconductor lines 27 are arranged in a same layer as an active layer of the plurality of pixels 1 (not shown), wherein by arranging the semiconductor lines 27 in a same layer as the active layer, the fabricating process can be simplified;

the passivation layer 25 arranged over the plurality of semiconductor lines 27 and between neighboring semiconductor lines 27;

the electrode layer 26 arranged over the passivation layer 25.

The plurality of semiconductor lines 27 are arranged in the rubbing direction. When the passivation layer 25 is formed on the semiconductor lines 27, the passivation layer 25 will be formed not only right above the semiconductor lines 27, but also between neighboring semiconductor lines 27. The passivation layer 25 between neighboring semiconductor lines 27 is lower than the passivation layer 25 right above the semiconductor lines 27, and grooves are formed between neighboring semiconductor lines 27. The grooves are parallel with the plurality of semiconductor lines 27, i.e., in the rubbing direction. Furthermore, grooves in the rubbing direction will also be formed in the electrode layer 26 over the passivation layer 25 at positions corresponding to grooves in the passivation layer 25, thus forming the slit patterns 2.

Since the slit patterns 2 are arranged in the rubbing direction, during the rubbing process, the slit patterns 2 can guide the rubbing cloth to move in the rubbing direction. Accordingly, the alignment of the rubbing cloth is prevented from changing in the rubbing process, a good alignment layer is formed, and rubbing Mura is avoided.

Figure 6:
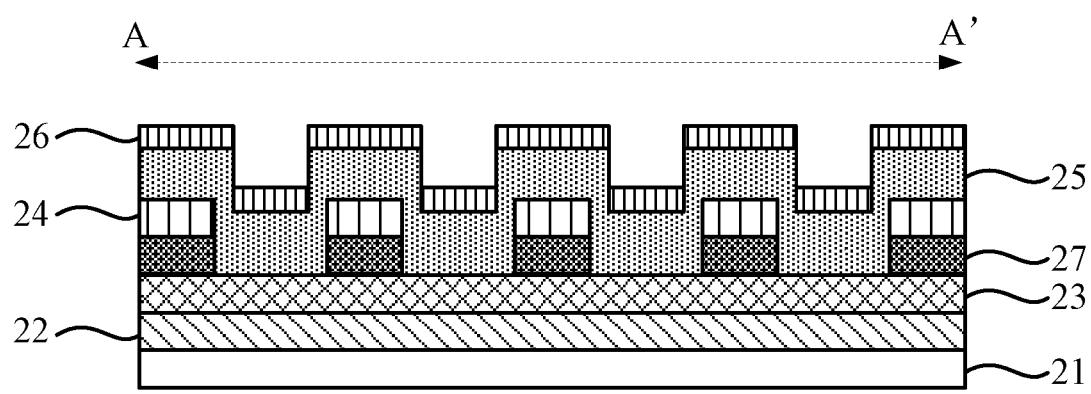
FIG. 6 shows a cross-sectional view along AA' of a display panel according to another embodiment of the present invention.

As shown in FIG. 6, for example, the slit patterns 2 comprise:

a plurality of semiconductor lines 27 arranged in the rubbing direction, wherein the plurality of semiconductor lines 27 are arranged in a same layer as an active layer of the plurality of pixels 1, wherein by arranging the semiconductor lines 27 in a same layer as the active layer, the fabricating process can be simplified;

the plurality of metal lines 24 arranged over the plurality of semiconductor lines 27 and in the rubbing direction, wherein the plurality of metal lines 24 are arranged in a same layer as a source/drain in plurality of pixels 1, wherein by arranging the metal lines 24 in a same layer as the source and drain layer, the fabricating process can be simplified;

the passivation layer 25 arranged over the plurality of metal lines 24 and between neighboring metal lines 24;

the electrode layer 26 arranged over the passivation layer 25.

Both the plurality of semiconductor lines 27 and the plurality of metal lines 24 are arranged in the rubbing direction. When the passivation layer 25 is formed on the plurality of metal lines 24, the passivation layer 25 will be formed not only right above the plurality of metal lines 24, but also between neighboring metal lines 24 and between neighboring semiconductor lines 27. The passivation layer 25 between neighboring semiconductor lines 27 and between neighboring metal lines 24 is lower than the passivation layer 25 right above the metal lines 24, thus forming grooves. The grooves are parallel with the plurality of semiconductor lines 27 and the plurality of metal lines 24, i.e., in the rubbing direction. Furthermore, grooves in the rubbing direction will also be formed in the electrode layer 26 over the passivation layer 25 at positions corresponding to grooves in the passivation layer 25, thus forming the slit patterns 2.

In an exemplary embodiment, the slit patterns 2 are arranged in a topmost layer of the plurality of functional layers at position s corresponding to gate lines.

The slit patterns 2 are arranged in the topmost layer (e.g., a common electrode) in the plurality of functional layers. During the rubbing alignment process, the rubbing cloth directly contacts the slit patterns 2, so that the slit patterns 2 well guide the rubbing cloth to move in the rubbing direction. The slit patterns 2 are arranged at positions corresponding to gate lines, so that slits in the slit patterns 2 are closely arranged and well guide in the rubbing alignment process.

In addition, the rubbing direction in the rubbing process is generally perpendicular with gate lines. By arranging the slit patterns 2 on the common electrode corresponding to gate lines, it can be ensured that the common electrode with the slit patterns 2 corresponds to gate lines, so that the slit patterns 2 are arranged in each pixel 1. This ensures that during the rubbing alignment process, the rubbing cloth can be continuously guided by the slit patterns 2, accuracy of the rubbing alignment direction is ensured, and rubbing Mura is further avoided.

In an exemplary embodiment, each slit of the slit patterns 2 has a width of 13 μm~15 μm.

The slits have a width of 13 μm~15 μm, which is comparable with a diameter of the rubbing cloth during the current rubbing process, so that the rubbing cloth can be guided more smoothly. Of course, the width of slits can also be set as required.

The above display substrate comprises but not limited to ADS and TN (twist nematic) type substrate. In case of other type of substrates, the layer in which the slit patterns 2 are arranged can be set as required.

An embodiment of the present invention further provides a display device, comprising any one of the display substrate as described above.

It is noted that the display device in the present embodiment can be any product or component with a display function, such as an electronic paper, a mobile phone, a tablet, a TV set, a notebook computer, a digital photo frame, a navigator.

An embodiment of the present invention further provides a method for fabricating a display substrate, comprise:

during forming a plurality of pixels 1, forming between at least two pixels 1 in the plurality of pixels 1, a plurality of slit patterns 2 with a plurality of slits in the rubbing direction.

Forming the plurality of slit patterns comprises:

forming a plurality of slit patterns on at least one functional layer in the plurality of functional layers.

Figure 7:
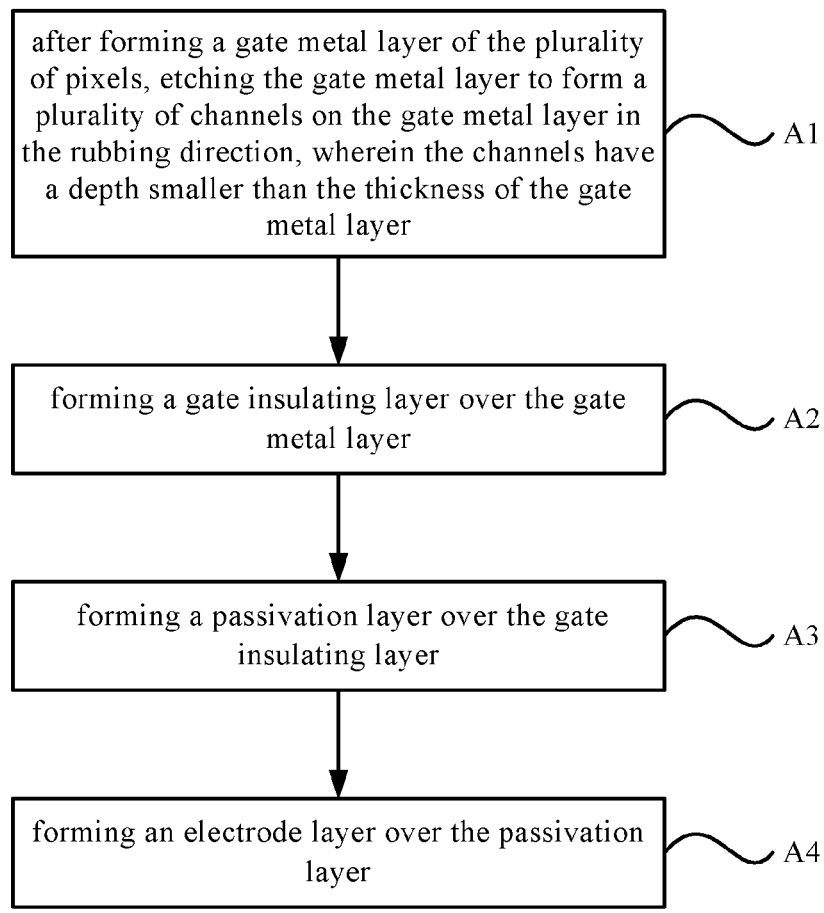
FIG. 7 shows a schematic flowchart of a method for fabricating slit patterns according to an embodiment of the present invention.

As shown in FIG. 7, forming the slit patterns comprises:

A1, after forming a gate metal layer of the plurality of pixels, etching the gate metal layer to form a plurality of channels on the gate metal layer in the rubbing direction, wherein the channels have a depth smaller than the thickness of the gate metal layer;

A2, forming a gate insulating layer over the gate metal layer;

A3, forming a passivation layer over the gate insulating layer;

A4, forming an electrode layer over the passivation layer.

Figure 8:
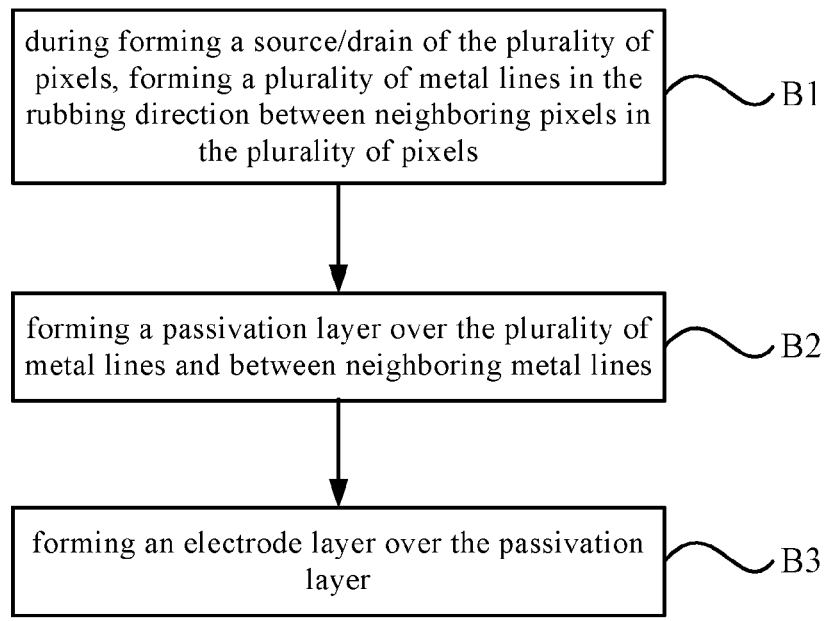
FIG. 8 shows a schematic flowchart of a method for fabricating slit patterns according to an embodiment of the present invention.

As shown in FIG. 8, for example, forming the slit patterns 2 comprises:

B1, during forming a source/drain of the plurality of pixels 1, forming a plurality of metal lines 24 in the rubbing direction between neighboring pixels 1 in the plurality of pixels 1;

B2, forming a passivation layer 25 over the plurality of metal lines 24 and between neighboring metal lines 24;

B3, forming an electrode layer 26 over the passivation layer 25.

Figure 9:
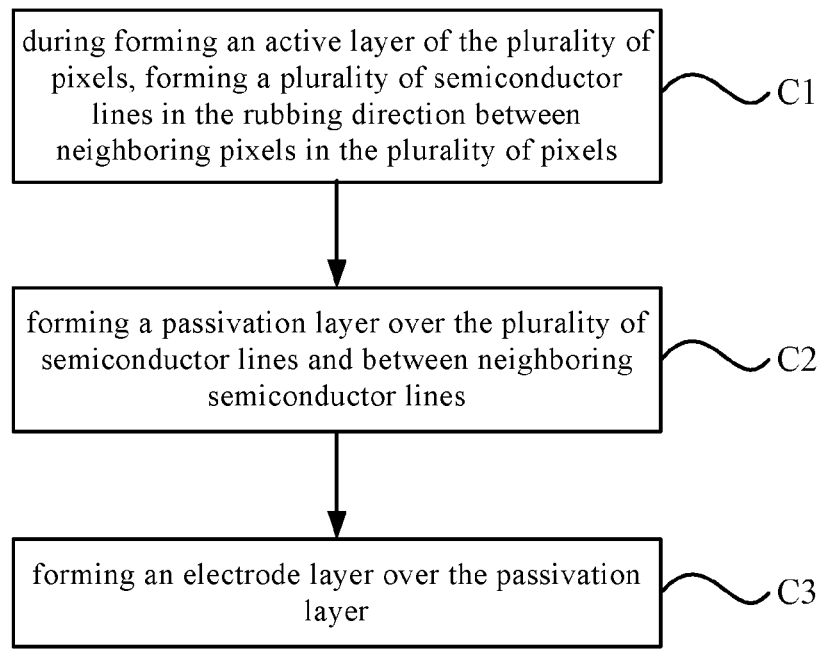
FIG. 9 shows a schematic flowchart of a method for fabricating slit patterns according to another embodiment of the present invention.

As shown in FIG. 9, for example, forming the slit patterns 2 comprises:

C1, during forming an active layer of the plurality of pixels 1, forming a plurality of semiconductor lines 27 in the rubbing direction between neighboring pixels 1 in the plurality of pixels 1;

C2, forming a passivation layer 25 over the plurality of semiconductor lines 27 and between neighboring semiconductor lines 27;

C3, forming an electrode layer 26 over the passivation layer 25.

Figure 10:
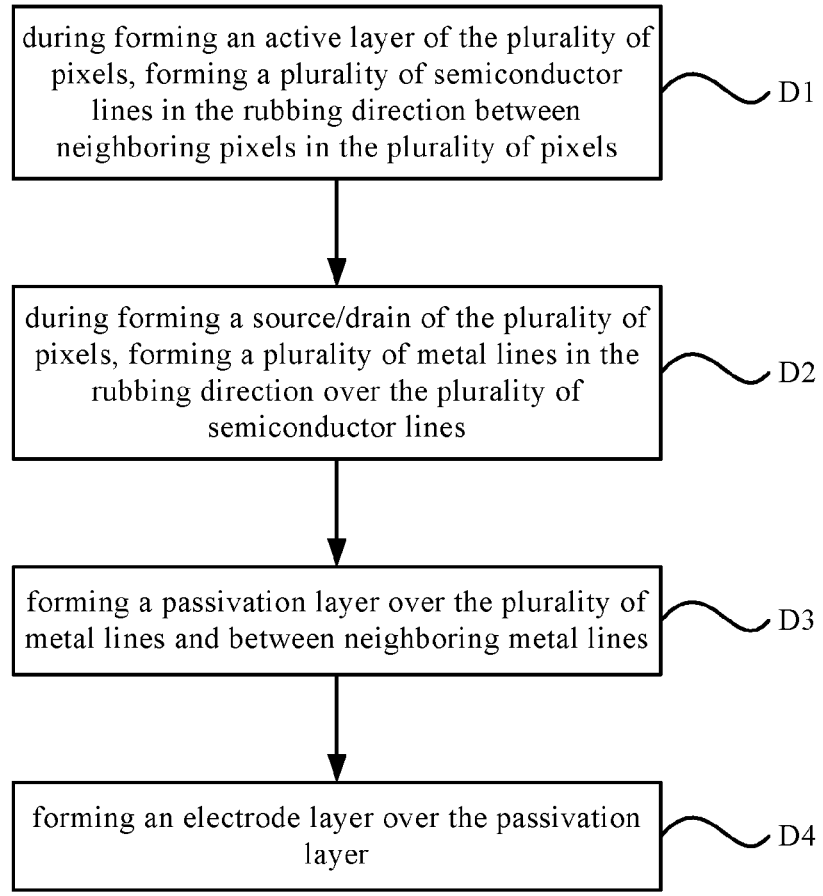
FIG. 10 shows a schematic flowchart of a method for fabricating slit patterns according to another embodiment of the present invention.

As shown in FIG. 10, for example, forming the slit patterns 2 comprises:

D1, during forming an active layer of the plurality of pixels 1, forming a plurality of semiconductor lines 27 in the rubbing direction between neighboring pixels 1 in the plurality of pixels;

D2, during forming a source/drain of the plurality of pixels 1, forming a plurality of metal lines 24 in the rubbing direction over the plurality of semiconductor lines 27;

D3, forming a passivation layer 25 over the plurality of metal lines 24 and between neighboring metal lines 24;

D4, forming an electrode layer 26 over the passivation layer 25.

In an exemplary embodiment, forming the slit patterns 2 comprises:

forming the slit patterns 2 in a topmost layer of the plurality of functional layers at positions corresponding to gate lines or data lines.

The forming process in the above flow for example can comprise a film forming process like deposition, sputtering, and a patterning process like etching.

The technical solutions of the present invention have been described with reference to drawings. In the prior art, several factors in the rubbing process may cause variation in rubbing alignment. According to technical solutions of the present invention, by arranging the slit patterns which comprise slit in rubbing direction, during a rubbing alignment process, the slit patterns can guide the rubbing cloth to move in the rubbing direction. Accordingly, the alignment of the rubbing cloth is prevented from changing in the rubbing process, a good alignment layer is formed, rubbing Mura is avoided, and the lifetime of the rubbing cloth is extended.

It is noted that in drawings a layer and region may be exaggerated in dimension for clarity. It is understood that when an element or layer is referred to as "on" another element or layer, it can directly be on another element, or an intervening layer may exist. In addition, it is understood that, when an element or layer is referred to as "below" another element or layer, it can be directly below another element, or one or more intervening layer or element may exist. In addition, it is understood that when a layer or element is referred to as "between" two or more elements, it can be the unique layer between these two or more elements, or one or more intervening layer or element may exist. Similar reference numerals indicate similar elements throughout the present disclosure.

In the present invention, unless indicated otherwise, the term "a plurality of" refers to two or more.

Apparently, the ordinary skilled person in the art can make various modifications and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

What is claimed is:

1. A display substrate, comprising:
    a plurality of pixels, and
    a plurality of slit patterns, which are arranged between at least two of the plurality of pixels respectively and comprise a plurality of slits arranged in a rubbing direction.

2. The display substrate of claim 1, comprising a plurality of functional layers,
    wherein the plurality of slit patterns are arranged on at least one of the plurality of functional layers.

3. The display substrate of claim 2, wherein the plurality of functional layers comprise: a source/drain layer, a gate metal layer, a gate insulating layer, a semiconductor layer, a passivation layer, a pixel electrode layer, a common electrode layer, and a color filter layer.

4. The display substrate of claim 2, wherein the slit patterns comprise:
    a plurality of channels arranged on a gate metal layer in the rubbing direction, wherein the channels have a depth smaller than the thickness of the gate metal layer;
    a gate insulating layer arranged over the gate metal layer;
    a passivation layer arranged over the gate insulating layer;
    an electrode layer arranged over the passivation layer.

5. The display substrate of claim 2, wherein the slit patterns comprise:
    a plurality of metal lines arranged in the rubbing direction,
    wherein the plurality of metal lines are arranged in a same layer as a source/drain of the plurality of pixels;
    a passivation layer arranged on the plurality of metal lines and between neighboring metal lines;
    an electrode layer arranged over the passivation layer.

6. The display substrate of claim 2, wherein the slit patterns comprise:
    a plurality of semiconductor lines arranged in the rubbing direction,
    wherein the plurality of semiconductor lines are arranged in a same layer as an active layer of the plurality of pixels;
    a passivation layer arranged on the plurality of semiconductor lines and between neighboring semiconductor lines;
    an electrode layer arranged over the passivation layer.

7. The display substrate of claim 2, wherein the slit patterns comprise:
    a plurality of semiconductor lines arranged in the rubbing direction,
    wherein the plurality of semiconductor lines are arranged in a same layer as an active layer of the plurality of pixels;
    a plurality of metal lines arranged on the plurality of semiconductor lines and in the rubbing direction,
    wherein the plurality of metal lines are arranged in a same layer as a source/drain of the plurality of pixels;
    a passivation layer arranged on the plurality of metal lines and between neighboring metal lines;
    an electrode layer arranged over the passivation layer.

8. The display substrate of claim 2, wherein the slit patterns are arranged in a topmost layer of the plurality of functional layers at positions corresponding to gate lines or data lines.

9. The display substrate of claim 1, wherein each slit of the slit patterns has a width of 13 µm~15 µm.

10. A display device, comprising a display substrate, wherein the display substrate comprises a plurality of pixels, and a plurality of slit patterns, which are arranged between at least two of the plurality of pixels respectively and comprise a plurality of slits arranged in a rubbing direction.

11. The display device of claim 10, where the display panel comprises a plurality of functional layers, and the plurality of slit patterns are arranged on at least one of the plurality of functional layers.

12. The display device of claim 11, wherein the plurality of functional layers comprise: a source/drain layer, a gate metal layer, a gate insulating layer, a semiconductor layer, a passivation layer, a pixel electrode layer, a common electrode layer, and a color filter layer.

13. The display device of claim 11, wherein the slit patterns comprise:
    a plurality of channels arranged on a gate metal layer in the rubbing direction, wherein the channels have a depth smaller than the thickness of the gate metal layer;
    a gate insulating layer arranged over the gate metal layer;
    a passivation layer arranged over the gate insulating layer;
    an electrode layer arranged over the passivation layer.

14. A method for fabricating a display substrate, comprising:
    during forming a plurality of pixels, forming a plurality of slit patterns between at least two pixels of the plurality of pixels, wherein the plurality of slit patterns comprise a plurality of slits in a rubbing direction.

15. The method of claim 14, wherein forming the plurality of slit patterns comprises:
    forming the plurality of slit patterns on at least one of the plurality of functional layers.

16. The method of claim 15, wherein forming the slit patterns comprises:
    after forming a gate metal layer of the plurality of pixels, etching the gate metal layer to form a plurality of channels on the gate metal layer in the rubbing direction, wherein the channels have a depth smaller than the thickness of the gate metal layer;
    forming a gate insulating layer over the gate metal layer;
    forming a passivation layer over the gate insulating layer;
    forming an electrode layer over the passivation layer.

17. The method of claim 15, wherein forming the slit patterns comprises:
    during forming a source/drain of the plurality of pixels, forming a plurality of metal lines in the rubbing direction between neighboring pixels in the plurality of pixels;

forming a passivation layer over the plurality of metal lines and between neighboring metal lines;

forming an electrode layer over the passivation layer.

18. The method of claim 15, wherein forming the slit patterns comprises:

during forming an active layer of the plurality of pixels, forming a plurality of semiconductor lines in the rubbing direction between neighboring pixels in the plurality of pixels;

forming a passivation layer over the plurality of semiconductor lines and between neighboring semiconductor lines;

forming an electrode layer over the passivation layer.

19. The method of claim 15, wherein forming the slit patterns comprises:

during forming an active layer of the plurality of pixels, forming a plurality of semiconductor lines in the rubbing direction between neighboring pixels in the plurality of pixels;

during forming a source/drain of the plurality of pixels, forming a plurality of metal lines in the rubbing direction over the plurality of semiconductor lines;

forming a passivation layer over the plurality of metal lines and between neighboring metal lines;

forming an electrode layer over the passivation layer.

20. The method of claim 15, wherein forming the slit patterns comprises:

forming the slit patterns in a topmost layer of the plurality of functional layers at positions corresponding to gate lines or data lines.

* * * * *